United States Patent [19]
Mantl

[11] Patent Number: 5,958,505
[45] Date of Patent: Sep. 28, 1999

[54] LAYERED STRUCTURE WITH A SILICIDE LAYER AND PROCESS FOR PRODUCING SUCH A LAYERED STRUCTURE

[75] Inventor: Siegfried Mantl, Jülich, Germany

[73] Assignee: Forschungszentrum Julich GmbH, Julich, Germany

[21] Appl. No.: 08/894,871

[22] PCT Filed: Feb. 1, 1996

[86] PCT No.: PCT/DE96/00172

§ 371 Date: Aug. 5, 1997

§ 102(e) Date: Aug. 5, 1997

[87] PCT Pub. No.: WO96/24952

PCT Pub. Date: Aug. 15, 1996

[30] Foreign Application Priority Data

Feb. 6, 1995 [DE] Germany .................... 195 03 641

[51] Int. Cl.$^6$ .................... B05D 5/12; H01L 21/8238
[52] U.S. Cl. .................... 427/96; 427/126.1; 427/397.7; 427/419.7; 427/376.2; 438/225; 438/297; 438/362; 438/439; 438/649; 438/655; 438/664; 438/FOR 229
[58] Field of Search .................... 427/96, 126.1, 427/376.2, 397.7, 419.7; 438/225, 297, 362, 439, 444, 453, 945, FOR 229, 649, 655, 664; 257/509, 647, 770

[56] References Cited

U.S. PATENT DOCUMENTS 4,971,655 11/1990 Stefano et al. .
5,624,871 4/1997 Teo et al. .................... 438/453
5,635,426 6/1997 Hayashi et al. .................... 438/453

FOREIGN PATENT DOCUMENTS 0 547 030 A3 6/1993 European Pat. Off. .

OTHER PUBLICATIONS

Miyao et al., "Characterization and application of fine–patterned Si/CoSi2/Si double heterostructures fabricted by self–aligned, two step MBE", Journal of Crystal Growth, vol. 111, May 1991.
IBM Technical Disclosure, "Interconnect Fabrication by local metal oxidation", Jul. 1991.
Dass et al., "Growth of epitaxial CoSi2 on (100) Si", Applied Physics Letters, vol. 58, Mar. 1991.
IBM Technical Disclosure Bulletin, "Pattering and etching of silicde layers", vol. 33, No. 10a, Mar. 1991.
Handbook of Multilevel Metallization for Integrated Circuits, by Wilson et al., pp. 32–96 no month available.
"Growth of epitaxial $CoSi_2$ on (100) Si" by Dass et al., Appl. Phys. Lett. 58 (12) Mar. 25, 1991.
"Patterning method for silicides based on local oxidatiob" by S. Mantl et al., Appl. Phys. Lett. 67 (23) Dec. 4, 1995.
Thermal Oxidation of Transition Metal Silicides by H. Jiang et al. (2194 Thin Solid Films, 140 (1986) Jun. 16, No. 1).
"Characterizetion and appliction of fine–patterned Si/$CoSi_2$/Si double heterostructures . . . " by Miyao et al., 2300 Journal of Crystal Growth 111 (1991)May II Nos. 1/4.
"Use of $TiSi_2$ to form metal–oxide–silicon field effect transistors . . . " by T. Yachi et al. (J. Vac.Sci. Technol. B 3(4), Jul./Aug. 1985.
Enhanced Oxidation of CVD Tungsten Silicide Films by Yanai et al. (1046B Extended Abstracts 86–1(1986) May No. 1.
Interconnect Fabrication by Local Metal Oxidation (IBM Technical Disclosure Bulletin vol. 34, No. 2 Jul. 1991).
Patterning and Etching of Silicide Layers (IBM Technical Disclosure Bulletin Vo. 33 No. 10A Mar. 1991).
Silicon Processing for the VLSI Era, vol. 2, Process Integration Mesotaxy: Single–crystal growth of buried $CoSi_2$ layers, pub. Nov. 11, 1986.

Primary Examiner—Brian K. Talbot
Attorney, Agent, or Firm—Herbert Dubno

[57] ABSTRACT

A process for producing a layered structure in which a silicide layer on a silicon substrate is subjected to local oxidation to cause the boundary layer side of the silicide layer to grow into the silicon substrate.

5 Claims, 9 Drawing Sheets

LAYERED STRUCTURE WITH A SILICIDE LAYER AND PROCESS FOR PRODUCING SUCH A LAYERED STRUCTURE

CROSS REFERENCE TO RELATED APPLICATIONS

This application is a national stage of PCT/DE 96/00172 filed Feb. 1, 1996 and based, in turn, on German National application 195 03 641.7 filed Feb. 6, 1995 under the International Convention.

FIELD OF THE INVENTION

The invention relates to a process for producing a layered structure. Furthermore, the invention relates to a layered structure with a silicide layer. Further the invention relates to an electronic component containing such a layered structure. Finally the invention relates to a process for structuring such a layered structure.

BACKGROUND OF THE INVENTION

For numerous applications in the microelectronics field, such layered structures with metallically conductive or semiconductive structures buried especially in silicon are becoming increasingly significant. For realizing such structures, for example of buried interconnects, heretofore there have been no suitable layered structures and processes of manufacture directed to them. A process is known in the state of the art in which the significant steps are lithographic structuring and etching of troughs in silicon, optionally selective deposition of a metal, the filling of the troughs with, for example, $SiO_2$ and the removal of deposited materials can be mentioned.

This process is very expensive and, above all, is exceptionally problematical for submicron structuring magnitudes. Furthermore, in this process the danger of contamination of the metal/silicon boundary layer by undesired edge coverings is unavoidable. The production of epitactic layers is not possible therewith.

In the field of microelectronics, from "Silicides and Contacts for ULSI" in Handbook of Multilevel Metallization for Integrated Circuits, published by S. R. Wilson and C. J. Tracy, Noyes Publications, P. 32–96, 1993, two silicides, $TiSi_2$ and $CoSi_2$ have been described as state of the art, especially for the metallization of the source, gate and drain of metal oxide field effect transistors (MOSFET). Both suicides permit a self-adjusting process in the course of silicide formation and are characterized by a low electrical resistance of about 15 $\mu$ohm cm. Flat $p^+/n$ transitions with epitactic $CoSi_2$ layers are advantageous in comparison to polycrystalline metallization. From Appl. Phys. Lett. 58, P. 1308–1310, 1991, it is known to produce monocrystalline $CoSi_2$ layers with the so-called TiCo process by sputter deposition and heat treatment. Monocrystalline $CoSi_2$ layers are characterized, by contrast with polycrystalline silicides by a significantly higher thermal stability: monocrystalline $CoSi_2$ layers, especially as they are buried in silicon, are stable to about 1200° C.

However, the hitherto known processes are precisely not suitable for the production of layered structures of the silicides since contamination and also a qualitatively insufficient passivation are problems which cannot be overcome.

OBJECTS OF THE INVENTION

It is therefore an object of the invention to obtain a layered structure of the originally described type which enables its use for the production of components in the field of silicon technology and which eliminates or significantly reduces the drawbacks arising in the state of the art. It is a further object of the invention to provide a method of producing such layered structures that these drawbacks are not manifest.

A further object of the invention is to obtain a component containing such a layered structure as can be employed in silicon technology.

SUMMARY OF THE INVENTION

These objects are attained, in accordance with the invention with a layered structure and a method or process for making same, in which a silicide layer is provided on a silicon-containing surface, e.g. a silicon substrate and the silicide layer is subjected to local oxidation to cause that silicide layer to grow into the silicon substrate.

It has been recognized that with local oxidation of the silicide layer from its boundary surface into the interior, the silicide layer can be oxidized to $SiO_2$. It is however also been recognized that simultaneously on the surface opposite this silicide boundary layer and connected with the silicon-containing surface or substrate surface the silicide during local oxidation grows into the silicon.

As a result, one obtains in this manner quite surprisingly a region in which the local oxidation in the depth of the layer dislocates part of the silicide layer. This layered structure has in the dislocated region of the resulting undulating silicide layer, quite surprisingly, the same layer form, especially both as to the crystal quality as well as to the retention of the planarity of the layer.

Indeed, the local oxidation of silicon is known per se and is used as the standard for insulation between neighboring components in highly integrated and the most highly integrated circuits (see Stanley Wolf, "Silicon Processing for the VLSI Era, Vol. 2, Process Integration." Lattice Press, Sunset Beach, Calif., 1990).

During the oxidation $SiO_2$ grows on the locations not covered by oxidation masks, into the silicon substrate and forms at these locations and in this manner locally an electrically insulating $SiO_2$ layer. That exhausts the hitherto known effect of local oxidation.

The present invention provides that, with continuing oxidation of the respective layer region, the latter is increasingly dislocated in its depth with respect to the neighboring layer regions.

It is especially advantageous when the process is carried out with the oxidation being of such duration that the locally dislocated layer region is torn finally from its neighboring layer regions and in this manner a separate layer region is formed while retaining the layer characteristics. Thus, for example, by suitable choice of the duration of the advance of local oxidation after the separation process, the separation of the neighboring layer regions can be established by the oxidation process in a targeted manner.

It is highly advantageous for the production process it is carried out in accordance with the totality of the features when, prior to the local oxidation, the silicide layer, by application and the formation of one or more further layers, is provided as a partly or totally buried layer in silicon and is then locally oxidized.

In this case initially the overlying layer or the overlying layers are oxidized. Finally the oxidation process is advanced sufficiently that it reaches the silicide layer and the local oxidation of this layer is then effected especially controllably via the duration of the oxidation process.

The local oxidation is effected in an oxidizing atmosphere by local application of sufficient energy on the desired site of the layered structure. It is thus proposed to create a local region with the oxidized layer structure, for example, with a locally sharply limited light bundle, for example of a laser and with a sufficient energy of the laser to locally oxidize the layers.

An advantageous variant of the process of the invention provides for the formation of a mask on the silicide layer. The energy can be provided by thermal treatment in a furnace. The mask can be formed by a process in which the $SiO_2$ provided in the local oxidation regions can be structured. Alternatively, deviations from these features are also possible; in this manner the $SiO_2$ layer can form an etch stop. For the local oxidation of the silicide layer this choice of the structuring is substantially irrelevant because an optionally provided $SiO_2$ layer forms at the start of the oxidation process growth into silicide layer.

The silicide layer can be formed as a polycrystalline layer. It is for certain desired reasons advantageous to form it as monocrystalline. To the extent that the silicide according to is selected as a metallically conductive material, especially $CoSi_2$, an interconnect structure for example can be formed in the silicon. For other purposes, it has been found to be advantageous to select a semiconductive silicide.

An especially advantageous process is obtained when the local oxidation is carried out a number of times and at least in part at other locations of the layer structure. In this manner one obtains a buried silicide structure in a plurality of different planes with silicon-containing material or substrate of a silicon base.

With the invention one can produce conductive and/or semiconductive silicide structures in the layer structure with individual requirements and corresponding three dimensional configurations. Or, in the case of already-produced structures, the latter can be newly structured according to the teachings formulated, for the formation of suitable structures or components.

Buried silicide layers, also in combination with superficial silicide layers can be structured by local oxidation with the aid of the process of the invention. When the local oxide (silicide with oxide) reaches the buried silicide, the latter is initially deformed, shifted and finally separated from the original layer. As a result, a buried silicide layer can be locally structured.

In a highly advantageous way, the silicon provided in the layer structure can be p-doped or n-doped in a three-dimensionally defined region, for example with the aid of ion implantation. Especially the region below a buried silicide layer can be implanted with ions and the silicon can be definitively doped in this manner. Finally it is advantageous to select as a silicon-containing surface (1), the surface of a silicon substrate (1) with the crystal orientation (1, 0, 0).

The silicide layer can be lithographically structured prior to the local oxidation so that after the oxidation process only buried silicide layers are provided on the originally silicided regions. This creates the possibility of providing planar insulation and buried silicide layers (for example buried metallization for interconnects) in one process step (a thermal oxidation with the same mask).

To carry out local oxidation, heat treatment in oxygen or water vapor can be used. It is, however, also conceivable to use for this purpose a gas mixture, for example, an oxygen-nitrogen mixture. In this manner a special kind of local oxidation can be effected, namely, an oxide-nitride formation, which for many purposes is desirable in place of the "simple" local oxidation. Furthermore, a reduction of the thermal loading can be, for example advantageous in which the local oxidation is carried out with increased gas pressure, for example oxygen in a high-pressure apparatus. By the selection of a suitable gas mixture and/or an elevated gas pressure, the quality of the layered structure and the fabrication process can be further increased.

The selection of the material for the substrate on a silicon basis can be varied selectively in accordance with the desire. Especially one can operate upon:

Episilicon wafers with various doping layers and doping structures,

Si-alloy layers, for example, buried $Si_{1-x}$—$Ge_x$, Si—C,

SOI (silicon on insulator, for example SIMOX, BESOI; Si on sapphire),

SOM (silicon on metal) substrate, e.g. buried $CoSi_2$ layer in silicon).

In addition, the process according to the invention and the layer structure can have the following advantages:

Both layers offset in depth are bound together only via their enveloping silicon. If the silicide used is that of a metal, for example $CoSi_2$, two metallizing planes electrically separated from one another can be provided with simultaneous passivation of the silicide structure. The silicide structured by local oxidation and silicon form, upon use of a metallic silicide, metallized MESA structures passivated by $SiO_2$, which form upon use, a MESA structure metallized a metallic silicide and passivated by $SiO_2$ which are components for especially vertical elements. Upon need, apart from the silicon nitride, silicon oxide can easily be selectively removed so that free-standing MESA structures result.

Upon removal of the silicon nitride, by a supplemental dosing of the silicon below the surface metallization, for example by low energy implantation, for example an ohmic contact can be generated in or through the silicide. This process can be carried out through further masks since the doping of the $SiO_2$ can be effected close to the surface which does not affect the insulation characteristics.

If the implantation is effected in the silicide by heat treatment, a diffusion of the doping agent, for example, from the $CoSi_2$ can result and with it a comparatively large area doping can be achieved. A laterally outward diffusion, otherwise a major problem, is excluded because of the lateral $SiO_2$ bounding (see the first example).

According to the process the layer structure has the following advantages:

Self adjusting,

Few and simple process steps,

Limited thermal loading especially in the case of an after-oxidation (small thermal budget).

The layered structures are unusually highly stable at high temperatures (depending upon material and layer thickness) (for example 100 nm thick $CoSi_2$ above 1100° C.), so that further processes at elevated temperatures are possible for further configurations of the layered structure. Based upon the special growth process within the interior, a contamination of the boundary layer (silicide-silicon $SiO_2$/silicon) is excluded and the production of monocrystalline buried silicide structures of exceptional qualities are further possible. To the extent a metallically conductive surface layer is chosen as the silicide layer, this can be obtained from a single surface metallization with two or more repeated uses of several metallization planes.

In addition, a variegated structuring process for silicide is provided. The structuring can be macroscopically large (for example with reference to a silicon wafer) or can lie far within the sub-μm region. This is the more significant since the two important silicides CoSi$_2$ and NiSi$_2$, do not react with reactive ion-etched structures, since they have no easily volatile compounds of Co and Ni with F or Cl at room temperature.

Possibilities of use of the process according to the invention as well as the layered structure according to the invention are found in the field of vertical transistors, as for example LOCOS-PBT, vertical MOSFETs, quasi-vertical buried FET. However, even in the field of producing contacts in buried doping layers in microsystem technology, for example, the development of new sensors, or in high-frequency metallization structures (coplanar and microstrip line technology) photo diodes, optical waveguides on a silicon basis, monocoupling elements for waveguides or modulators, the process or the layered structure can be introduced and used.

BRIEF DESCRIPTION OF THE DRAWING

In the following the invention is described with reference to the examples, and diagrammatically illustrated Figures, in greater detail. They show FIG. 1 a surface and buried metallizing plane with a silicide and local insulation of SiO$_2$ between regions II and III. I and II are connected by a buried interconnect, with FIG. 1(a) showing a silicon epilayer on high ohmic wafer and FIG. 1(b) showing a silicon epilayer on SOI-substrate;

FIGS. 2(a) to 2(c) are schematic illustrations of the individual process steps of the process of the invention:

FIG. 2(a) silicide layer on silicon substrate;

FIG. 2(b) oxidation mask comprised of SiO$_2$ and Si$_3$N$_4$ layers for local oxidation, FIG. 2(c) silicon dioxide formation on the silicon layer on the uncovered regions with local shifting of the silicon layer substrate, FIG. 2(d) silicide layer separated by continuous oxidation into a plurality of regions lying in different planes;

FIGS. 3(a)–3(c) show the manufacturing process for a short channel PBT with the aid of the process of the invention:

FIG. 3 modification of the construction according to FIG. 2d here on N$^+$-Si(100) with n-epi-layer, FIG. 3 Construction of the short channel PBT, FIG. 3(c) short channel PBT with additional buried silicide layer;

FIGS. 4(a)–4(c) show structuring of a buried silicide layer:

FIGS. 5(a)–5(c) show in the production of a vertical MOSFET:

FIG. 5(a) with the aid of the MESA structuring according to the process of the invention after removal of the oxidation mask, FIG. 5(b) vertical MOSFET structure with contacts (S indicating source, G gate (control electrode) and D drain (sink), FIG. 5(c) vertical MOSFET on SOI substrate;

FIGS. 6(a)–6(c) show an alternative fabrication process to FIG. 5 for vertical MOSFETS:

FIG. 6(a) MESA structure obtained according to the invention after partial removal of the oxide by dry etching, FIG. 6(b) structure after deposition of a nitride layer (selectively), FIG. 6(c) structure after wet chemical removal of the oxide and thermal gate-oxide formation, FIG. 6(d) vertical MOSFET after deposition of the gate contacts and removal of the nitride mask (S indicates source, G gate and D drain);

FIGS. 7(a) and 7(b) show schematically the construction of a vertical inverter with a silicide intervening layer (hatching as in FIGS. 6a to 6d); IN and OUT indicate input and output, Vdd and Vss the contacts for the drain and source:

FIG. 7(a) construction of the silicon doping layer between the silicide layers for the n-channel and p-channel MOSFET, FIG. 7(b) side elevational view;

FIGS. 9(a) and 9(b) are sections of the silicide grid for phase modulation in silicon waveguides of SOI:

SPECIFIC DESCRIPTION

Figure 2:
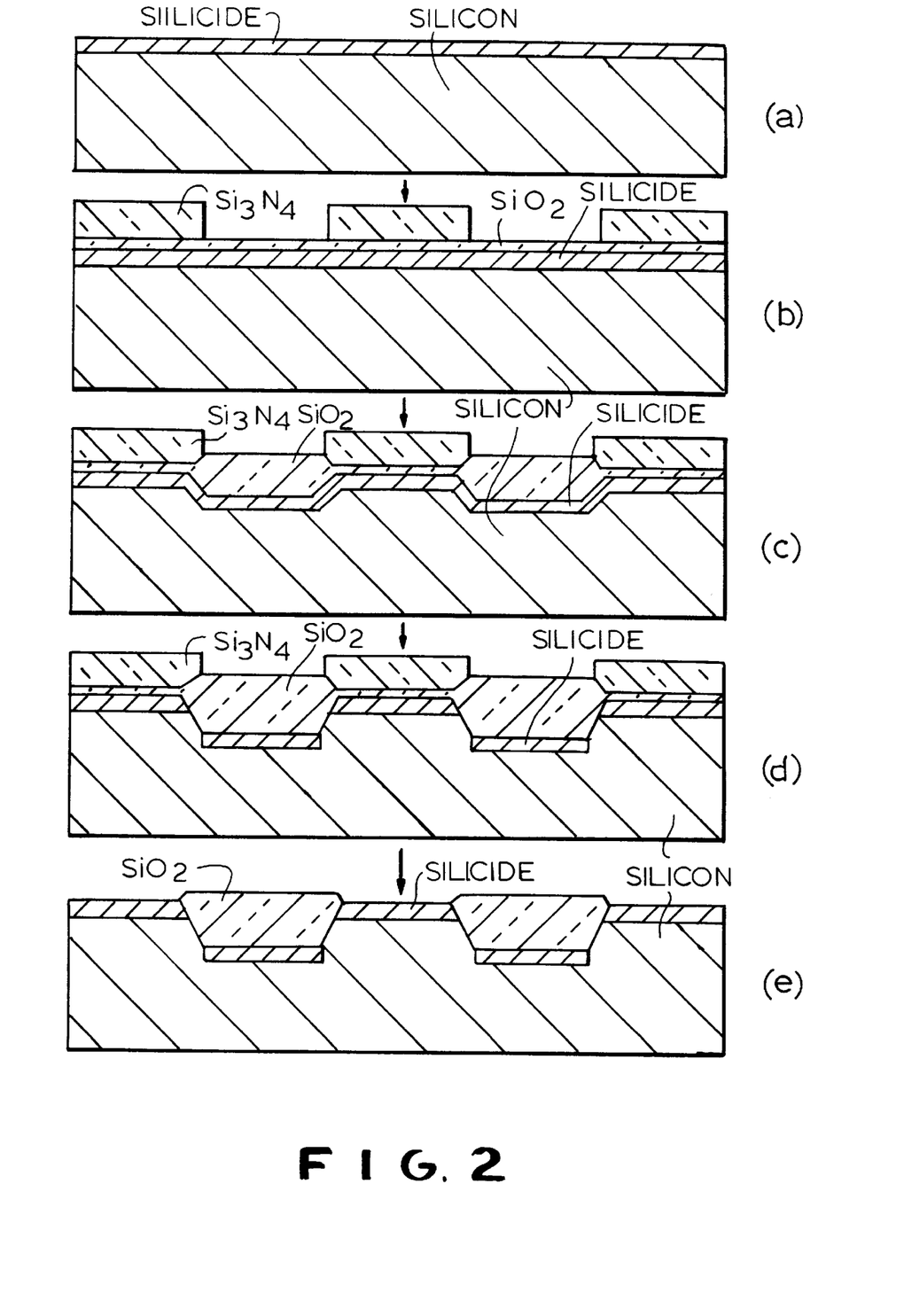

Example 1 (FIG. 2)

On a silicon substrate 1, a silicide surface layer 2 is initially deposited. The silicide layer 2 is metallic (e.g. CoSi$_2$), but can also be semiconductive (e.g. β-FeSi$_2$), preferably, however, with good planarity and morphology (FIG. 2a). For best results epitactic layers with high planarity and reduced boundary surface roughness are used since they show elevated thermal stability.

Thereafter, a thin SiO$_2$ layer 4 (about 10 nm thick), for example by thermal oxidation (e.g. oxidation in RTA is generated upon which a substantially thicker Si$_3$N$_4$ layer 5 (typically greater than 50 nm, for example 150 nm) is applied. The Si$_3$N$_4$ layer 5 is then structured by dry etching (FIG. 2b). Of subordinated significance is whether the SiO$_2$ layer is etched away therewith on the freely etched locations or is used as an etch stop.

There follows a thermal oxidation of the structured layer structure. The oxidation can be carried out wet or dry. When very high temperatures should be avoided, a wet oxidation is carried out. During the oxidation a SiO$_2$ layer is formed on the silicide 2 and the silicide layer is pressed into the silicon 1 at the locations not covered with the nitride 5. As a consequence, the usual planar silicide layer 2 is deformed at the transitions between oxidized and nonoxidized regions as shown in FIG. 2c.

The silicide layer 2 however remains initially coherent and retains its planarity apart from the very small transition regions. It is thus possible to produce from a planar surface layer a silicide layer of wave shape varying in depth.

With continuing oxidation, the silicide layer 2 is shoved further into the silicon 1 and gives rise to a very special effect: at a critical oxidation depth (dependent upon the silicide, silicide layer thickness and processing) the silicide layer 2 tears precisely at the transition regions as shown in FIG. 2d. It is important here that the layer even beneath the oxide remains planar and coherent. The layer thickness of the silicide at the oxidized locations has as a result of diffusive redistribution about a 20% reduction.

The tearing of the silicide layer 2 can also be achieved by a thermal treatment, for example, a brief heating of an already locally oxidized but yet coherent silicide layer 2 even with small SiO$_2$ layer thicknesses (for example with RTA of 1000° C., 60 s with a CoSi$_2$ layer with a thickness of about 70 nm).

After removal of the nitride layer 5 and the surface oxide (e.g. by dry etching) there results as shown in FIG. 2e approximately planar structures with the two separated silicide planes.

Figure 3:
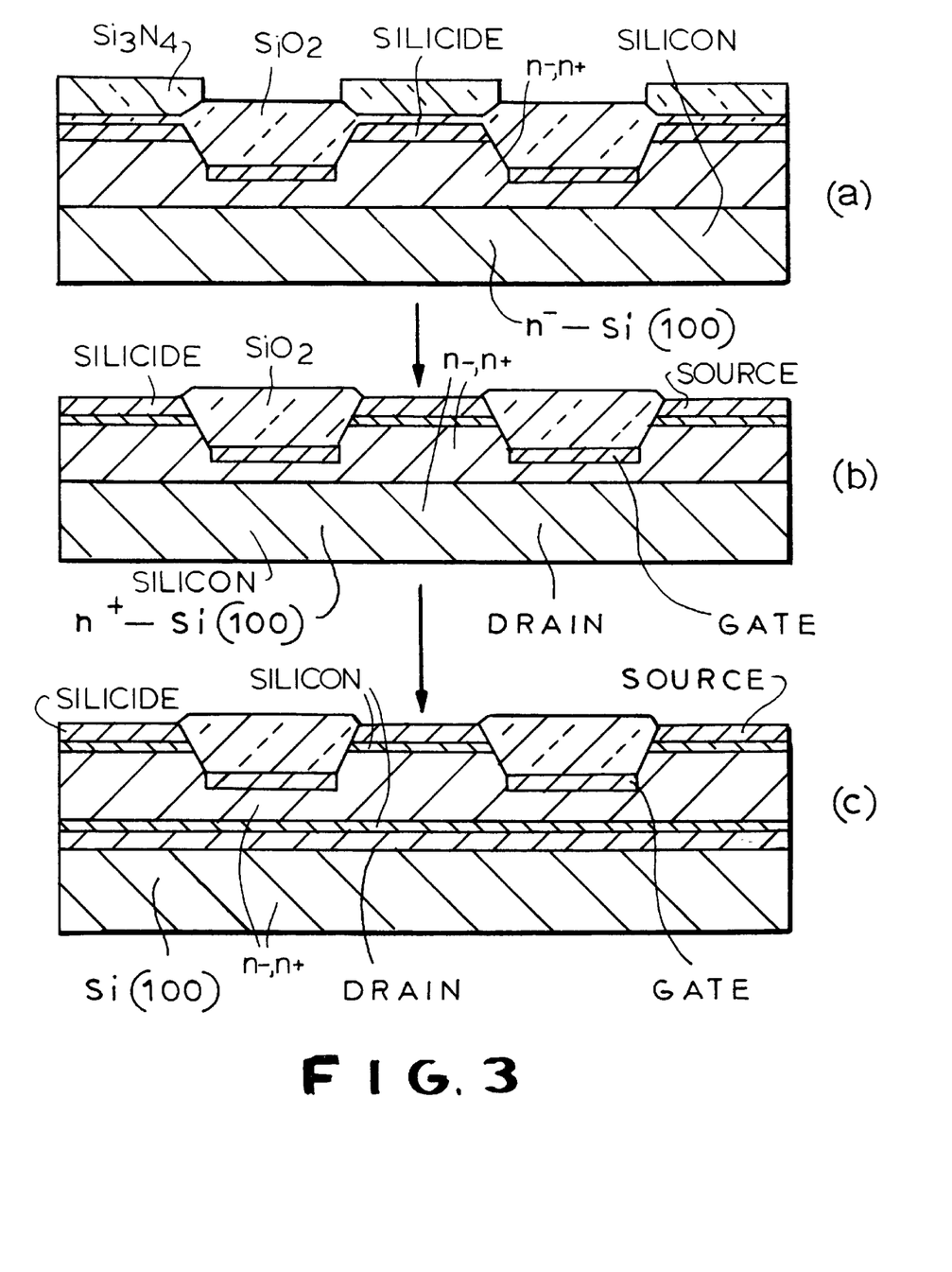

Example 2 (FIG. 3)

Process for production of a LOCOS- permeable base transistors (PBT) with short channels.

On a highly doped n-Si(100) wafer, a silicon-epilayer 1 is applied with a doping of $1 \times 10^{15}$ to $100 \times 10^{15}$ cm$^{-3}$ and a thickness of about 200 to 500 nm. Thereafter, a CoSi$_2$ layer 2 (about 30 to 100 nm) is deposited. Appropriate structuring at certain locations, especially for very small structures (submicron) of the epitactic CoSi$_2$ layer 2 is carried out by means of the so-called Go—Ti process, molecular beam epitaxy, molecular beam allotaxy or ion beam synthesis.

For carrying out the local oxidation, a thin SiO$_2$ layer 4 of about 10 nm thickness and a single 100 nm thick Si$_3$N$_4$ layer 5 is deposited (comparable to FIG. 2b). By 45 minute wet local oxidation at 850° C., a SiO$_2$ layer of about 300 nm thickness can be produced upon the CoSi$_2$ layer 2 (FIG. 3a). To ensure a certain tearing of the silicide layer at the transition locations, the sample can be thermally after-treated (for example 1000° C., 60 s at 70 nm CoSi$_2$). The heating conditions should be matched to the layer thickness of the silicide and the oxide.

Thereafter, the silicon nitride 5 and the SiO$_2$ on the source contact location are removed. To produce an ohmic source contact, a surface-forming implantation is used (FIG. 3b). The flat implant in the SoI$_2$ does not damage the electrical insulation characteristics of the SiO$_2$. This implanted doping can be activated subsequently by thermal treatment or especially for flat contacts which can be formed from the silicide by diffusion out of it and activated. This thermal treatment can also be used for the targeted tearing of the silicide layers (s.o.).

For the electrical contact, the gate must be liberated by dry etching (RIE) from the deeper-lying silicide at the contact locations. The drain contact can be realized on the backside of the wafer or through a contact hole to the highly doped wafer. FIG. 3b shows schematically the construction of a short channel PBT with buried metallic gate locally covered with silicon oxide.

Instead of a n$^+$ wafer with an epi-layer, for high-frequency purposes alternatively, a buried n$^+$ layer in an n$^-$ —Si (100) wafer can be used. Alternatively to the highly doped Si wafer, a SOI (SIMOX or BESOI) wafer with matched doping (with doping trough) can be used. A further alternative is the use of silicide double layers. Here the drain contact is configured through the deeper-lying silicide layer which has on its upper side highly doped silicon for good ohmic contact (FIG. 3c).

Figure 1:
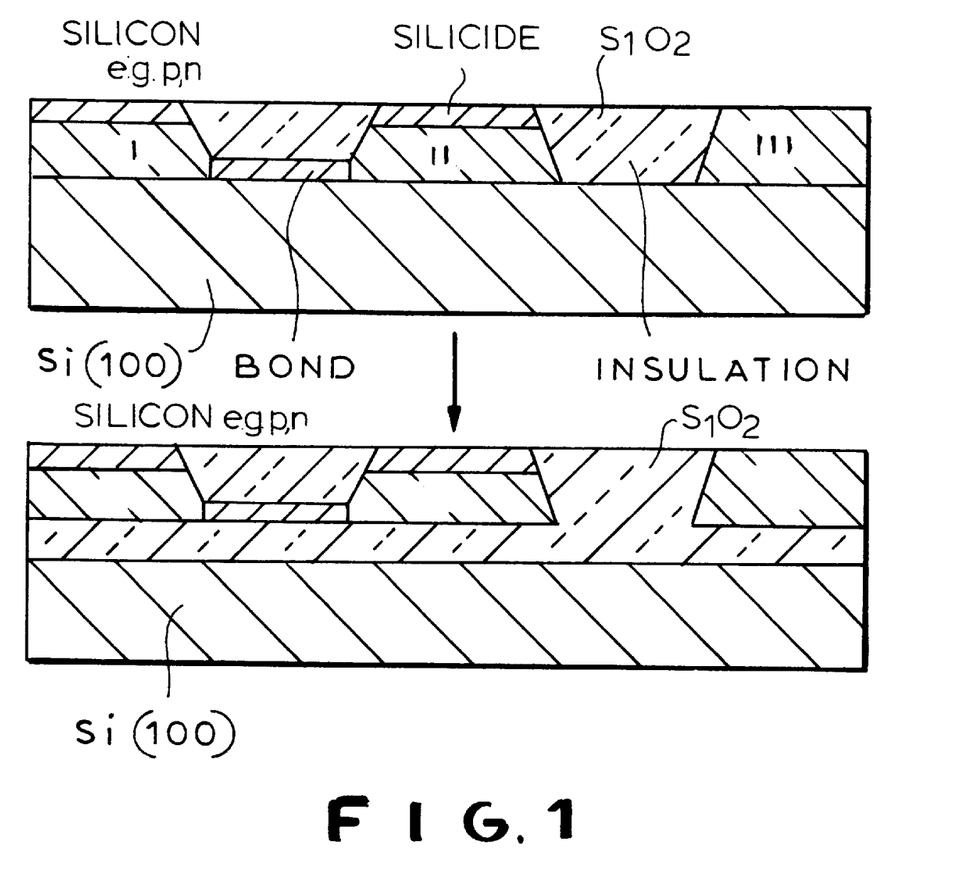

Example 3 (FIG. 1)

Production of buried interconnects and electrical insolation between electronic components by LOCOSI and LOCOS.

The standard LOCOS technology for lateral insolation of integrated components can be carried out in one step (or in succession) by the LOCOSI process according to the invention. Starting from an only partly silicided wafer 1, through use of the usual oxidation mask 3, local oxidation is carried out.

On the silicided locations, as a result of the oxidation, there arises buried electrical connections 2 (interconnects) while on the only oxidized regions 2 the electrical insolation is generated (FIG. 1). This use is especially advantageous with the selection of an SOI wafer, since the silicide layer 2 o−+r the local oxide can propagate by appropriate choice of the process parameters, to the insulator of the SOI wafer (e.g. SiO$_2$, sapphire) (FIG. 1b), so that detrimental effects on the substrate can be fully excluded.

Figure 4:
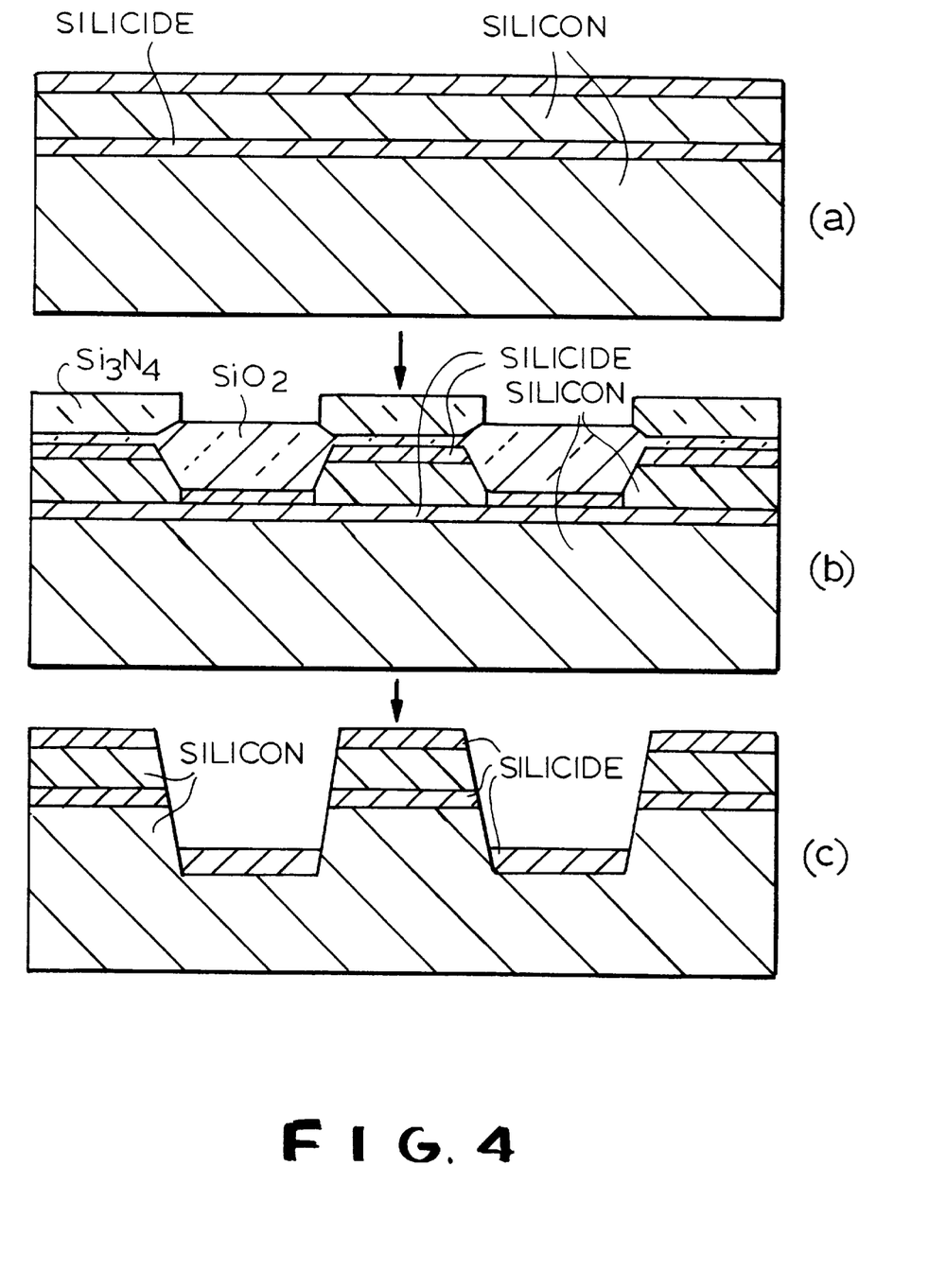
FIG. 4(a) silicide double layer.
FIG. 4(b) structure after partial local oxidation.
FIG. 4(c) structure after termination of the local oxidation.

Example 4 (FIG. 4)

Structuring of a buried silicide layer.

The LOCOSI process can also be used for the structuring of a buried silicide layer 2 with or without silicide surface layers (FIG. 4a). Thus a new three-dimensional structure can be obtained. A buried monocrystalline silicide layer 2 can only be produced with special procedures in silicon with (100) orientation. Especially suitable are ion-beam synthesis (A. E. White et al., Appl. Phys. Lett. 50, P. 95–97, 1987) and molecular-beam allotaxy (Mantl and H. L. Bay, Appl. Phys. Lett. 61, S 267–269, 1992). As has already been indicated in FIG. 2, initially an oxidation mask 3 is produced. Thereafter the sample is oxidized, the oxide reaches the buried silicide layer 2, the latter is shifted more deeply into the substrate similar to that shown in FIG. 2c.

Progressive oxidation, like with the surface layer 2, gives rise to a tearing of the buried silicide layer 2 (FIG. 4b). Even in this case, the targeted tearing of the silicide layer 2 at the transition region can be generated by a heat treatment as has already been indicated above. The silicide layer 2 is caused to penetrate deeper into the substrate by the oxidation but maintains its planarity.

Example 5

Process for producing a vertical MOSFET.

Vertical MOS transistors are of considerable significance for future highest level integration since, based upon the extremely short channel lengths, very high switching speeds can be expected. This can be produced by standard lithographic processes and reduced the spatial requirements. Vertical MOS transistors remain however stuck at the early stages of their technology development. As has already been indicated in connection with FIG. 2, MESA structures can be fabricated with the aid of the LOCOSI process from silicon and can be used for the production of a vertical MOS transistor. The surface silicide 2 can thus form the source and the lower lying silicide, the drain contact. A precondition for this is the use of suitable pre-doped silicon.

Figure 5:
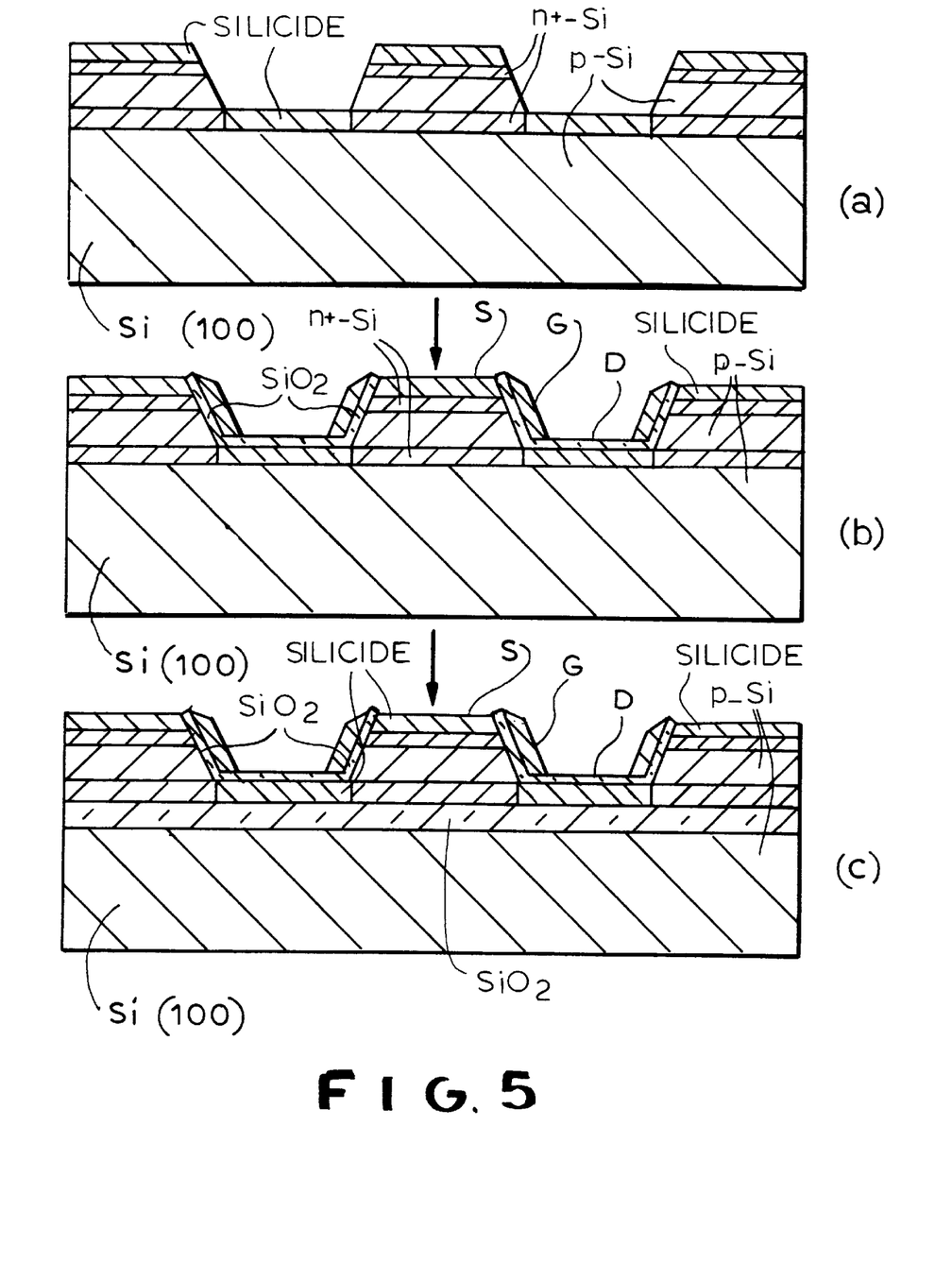

If instead of a simple Si wafer, one uses a silicon wafer already provided with doping layers, then one can fabricate for example the MESA structure shown in FIG. 5a for a small n-MOSFET by the LOCOSI process, whereby selectively the nitride 5 and the oxide are already removed. The doping layers in the silicon can be generated by standard processes, like for example epitactic deposition or ion implantation. Since the layered structure is thermally stable as a result of a further oxidation and thus is subjected to higher temperatures, the gate oxide can be produced by thermal oxidation.

For the still missing gate contact, polysilicon and/or metal can be applied on the vertically-running gate oxide and lithographically structured (FIG. 5b).

The described process can also be made with a wafer having an additional buried silicide layer. This gives rise to a short channel PBT with an especially low-ohmic drain contact for power and high frequency applications (FIG. 5c).

Figure 6:
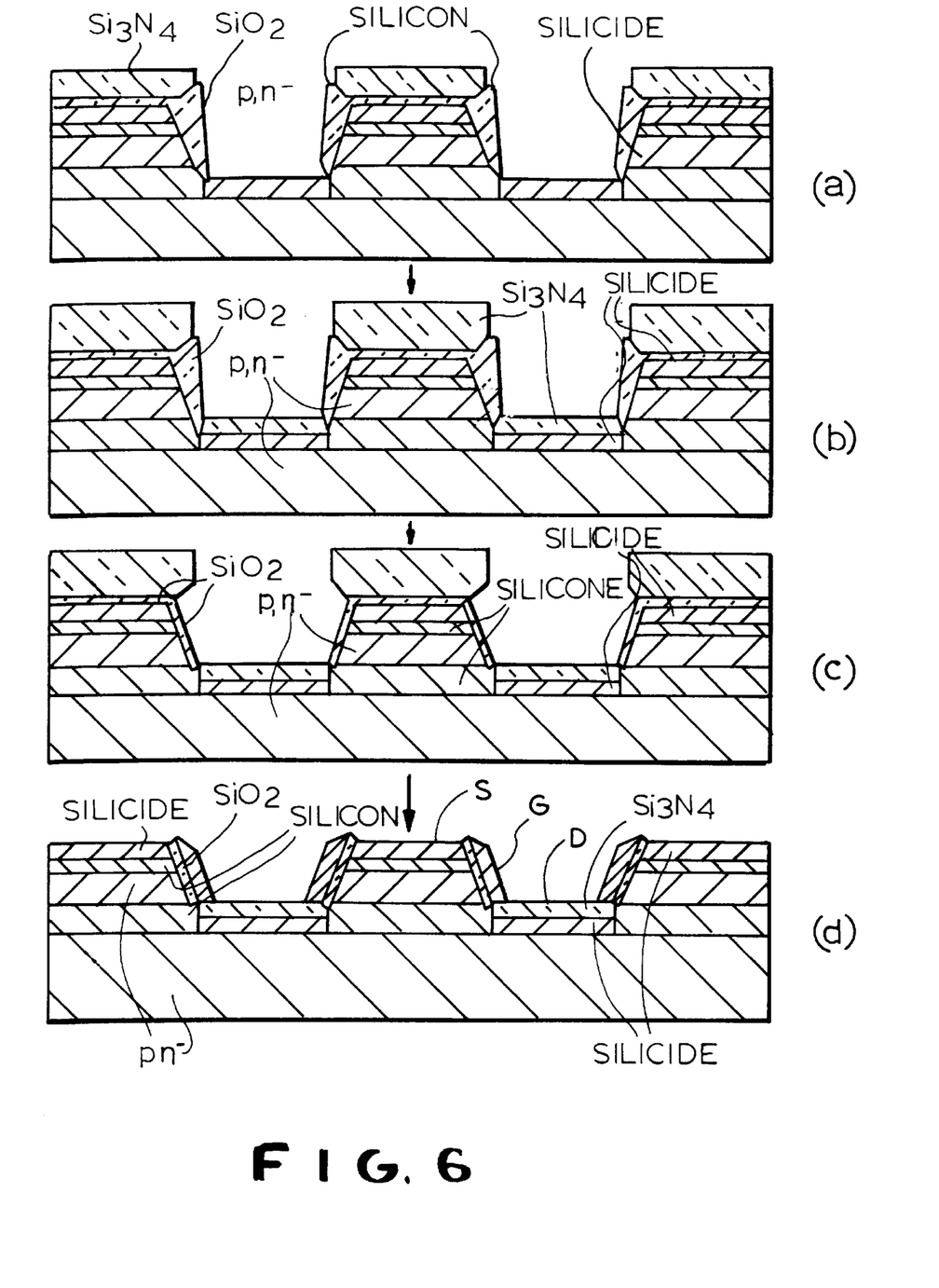

A further alternative in carrying out the process is illustrated in FIG. 6. Here the oxide resulting from the LOCOSI process is only partly removed by dry etching. This process does not require any new masks, since the nitride layer fulfills this purpose. Additionally, the silicide forms an extraordinary etch stop. The remaining oxide can be used as the gate oxide so that no further oxidation is required depending upon the requirements, the insulating layer (e.g. $Si_3N_4$) can now be doped on the silicide layer to facilitate making contact with the gate and to reduce the parasitic gate capacity (FIG. 6b). Now there is also the possibility of removing the oxide completely (or partially) by a wet chemical procedure and to form a new gate oxide by thermal oxidation. The nitride mask serves then also for deposition of the gate contact material, highly doped polysilicon and/or metal (FIG. 6c). Thereafter the nitride is removed. The principal structures of the vertical MOSFET are indicated in FIG. 6d.

Example 6

Production of a vertical inverter.

Figure 7:
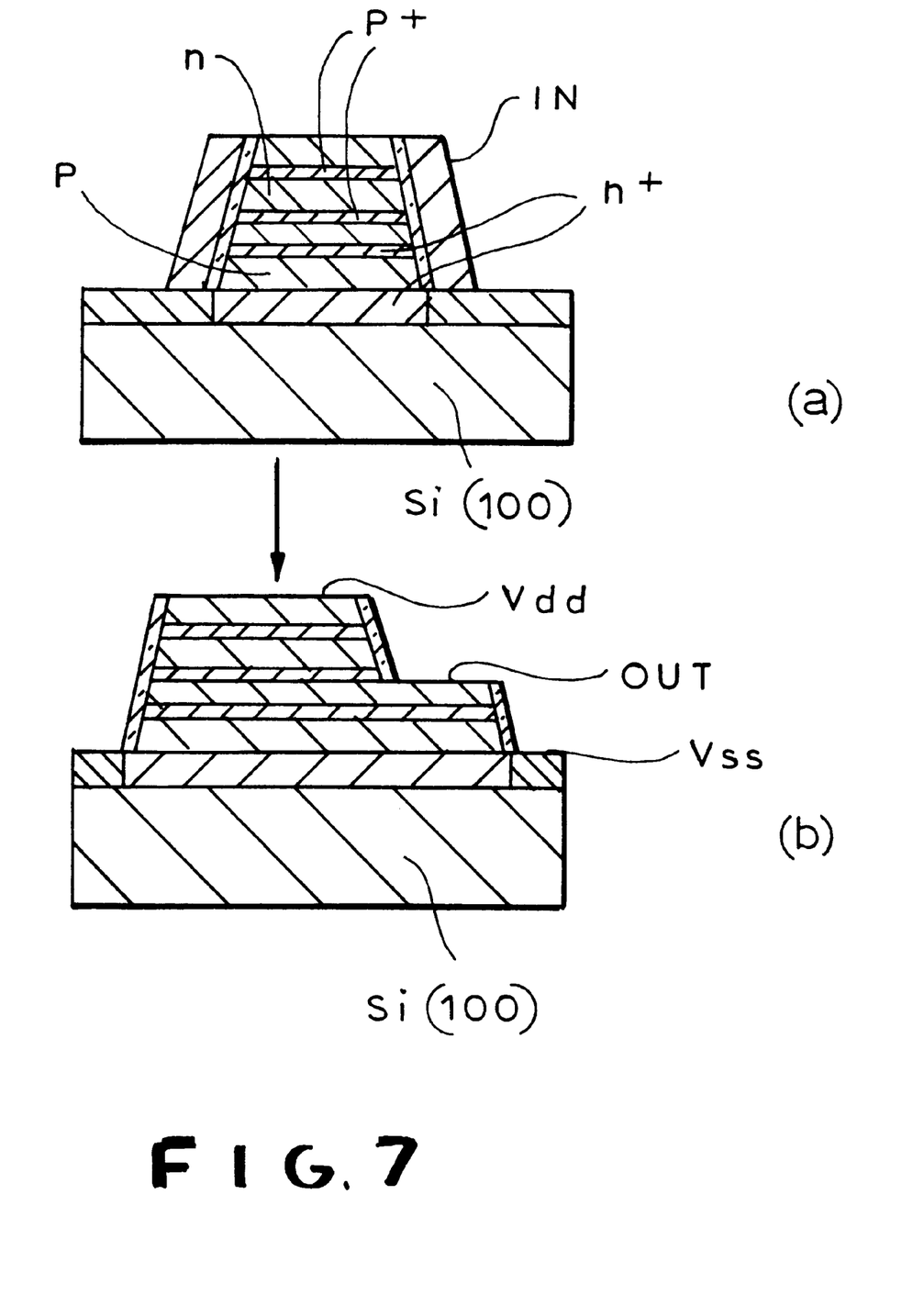

Starting from a buried silicide layer and a surface silicide layer (as in FIG. 4) with suitable doping layers in the silicon, two vertical MOSFETs can be fabricated for a vertical inverter (FIG. 7) by growing one upon another. The buried silicide layer, as indicated in Example 3, is structured by local oxidation (FIG. 4b). The realization of the gate can be effected as has been described for the vertical MOSFET. A significant new point, however, is that the oxidation of the MESA structure is effected together with lateral oxidation of the buried oxide layer and so that the gate contacts hang together with the n channel and the p channel MOSFETS. FIG. 7 shows schematically the construction of a vertical inverter as can be made with the aid of the LOCOSI process. Instead of the buried silicide layer with both $p^+/n^+$ layer sequence can be used.

Example 7

Process for producing a MESA structure for Si—Ge-MODFET (simultaneous metallization and passivation).

Figure 8:
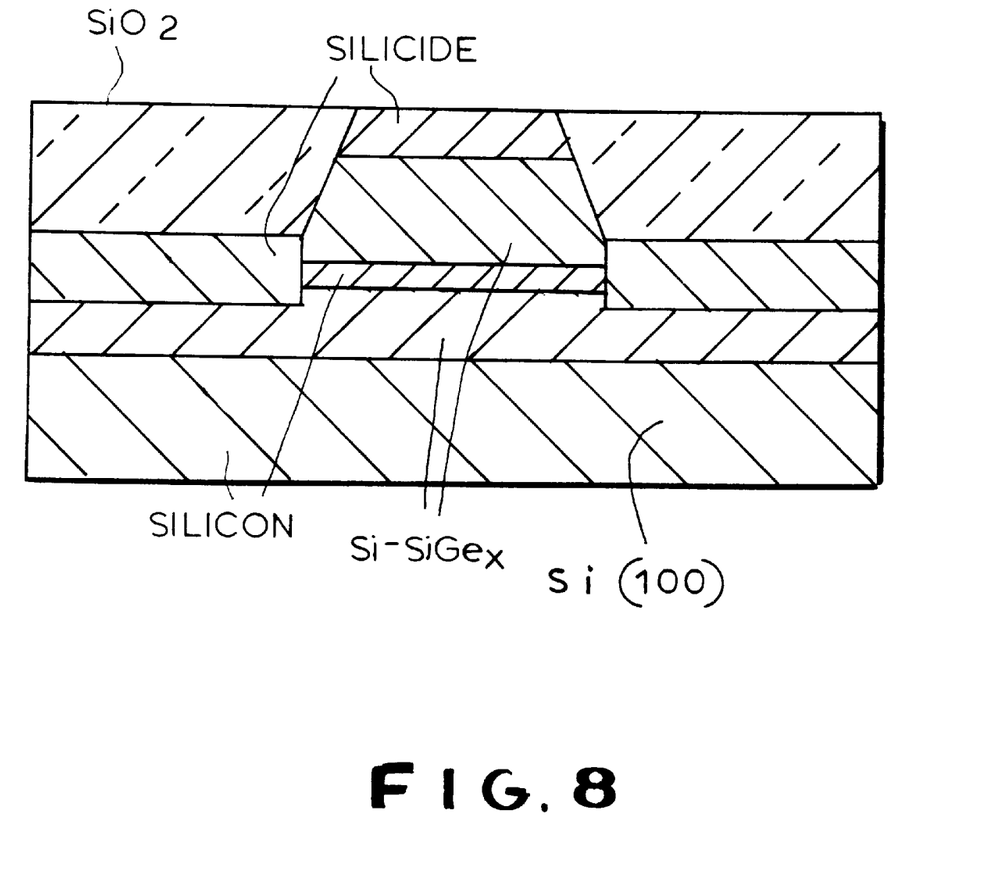
FIG. 8 is a diagram which shows the production of the MESA structure and the metallization of Si—Ge-MODFETs, which are comprised of Si—SiGe$_x$ characterized layers of different Si and Si—Ge layers with different germanium contents, the deepest lying silicide layer contacts the channels of the MODFET.

Si—GE based MODFETs (modulation doped FETs) can be metallized and passivated with the aid of the LOCOSI process. By application of a silicide layer (e.g. $CoSi_2$) upon the Si—$SiGe_x$—Si layered structure and subsequent carrying out of the LOCOSI process, the structure shown in FIG. 8 can be made. The silicide layer can be incorporated, by appropriate choice of its layer thickness about 50 to 150 nm, and the oxidation parameter, directly into the Si/$SiGe_x$/Si layered structure that an optimum contacting of the channels is achieved. If $CoSi_2$ is used as the silicide, then germanium is not incorporated in the $SiGe_x$ layer, but is introduced into the substrate beforehand prior to the formation of the silicide layer. The good conductivity of the silicide is therefore retained. By wet oxidation the temperature can be held sufficiently low (about 750 to 850° C.) so that neither detrimental Si—Ge interdiffusion nor significant out-diffusion from the doping will occur. Simultaneously the nonmetallized regions are passivated by $SiO_2$. The $SiO_2$ in the source and drain regions can be removed before the removal of the nitride by dry etching and then by implantation and thermal activation, the ohmic source and drain contacts are made. With the use of $CoSi_2$, a very low contact resistance can be reached which provides the expectation of a high power capacity of this HEMT (high electron mobility transistors).

Example 8

Production of a planar structured heterostructure like for example Si/semiconductive silicide/Si.

By local oxidation of semiconductive silicide layers on Si, planar silicon-based hetero-structures are produced relatively simply. The production can be effected corresponding to the process elaborated in connection with FIG. 2. Initially the semiconductive silicide layer 2 is produced on silicon 1. Production of an oxidation mask 3 ($SiO_2$ and $Si_3N_4$—as described above) allows the local oxidation of the silicide 2 as has been shown in FIG. 2c, there arises at a certain depth, a planar silicon/semiconductive silicide/silicon semiconductor.

Example 9

Production of optical waveguides.

The presented structuring possibilities enables also the production of silicon, silicon dioxide or silicon-germanium waveguides. The Si-MESA structures shown in FIG. 1b are the right dimensions (micrometers) for $SiO_2$ or silicide bounded planar Si waveguides. The [refractive] index jump at the boundary surfaces enable the transmission and light in the waveguide.

Example 10

Production of optical modulators with Si or Si—Ge waveguides.

Figure 9:
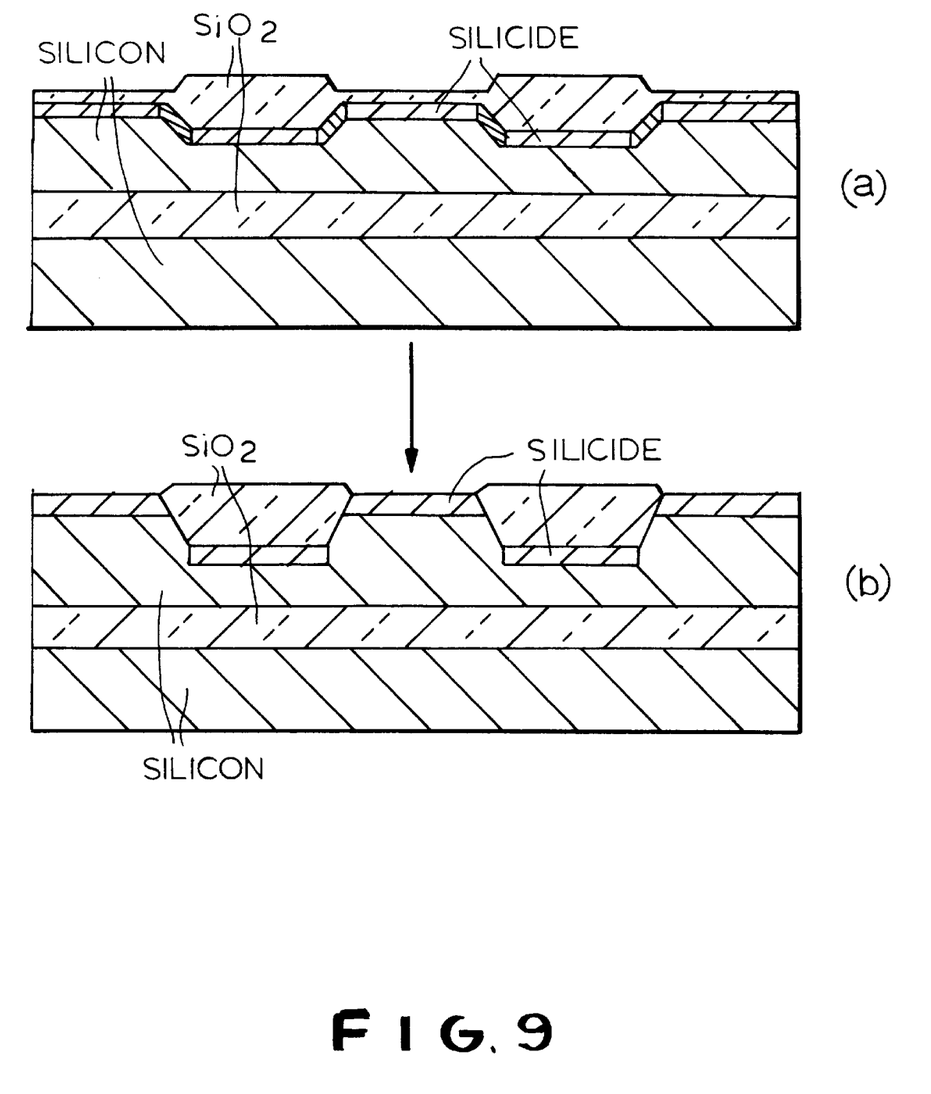
FIG. 9(a) coherent silicide structure with depth variations.
FIG. 9(b) periodic silicide grid (schematic)

If the structures shown in FIGS. 2c and 2e are produced on SOI substrates (for example SIMOX), these can then also be used for phase modulation of the light transmitted in a silicon waveguide as has been illustrated in FIG. 9.

I claim:

1. A process for producing a layered structure with a silicide layer comprising applying a silicide layer on a surface of a silicon-based substrate, applying a mask to the silicide layer, and locally oxidizing the silicide layer through the mask on a boundary surface thereof which is opposite to a boundary surface bonded to the surface of the silicon-based substrate to form a silicon oxide layer, for a time sufficient to separate a region of local oxidation of the silicide layer from a neighboring region of the silicide layer.

2. The process according to claim 1 wherein at least a part of the boundary surface to the boundary surface bonded to the surface of the silicon based substrate is provided with a further layer before local oxidation.

3. The process according to claim 1 wherein said mask is an $Si_3N_4$ layer formed on the silicide layer and is structured to provide the region of local oxidation.

4. The process according to claim 3, further comprising the step of removing the mask following local oxidation of the silicide layer.

5. The process according to claim 1 wherein said silicide layer is formed as a monocrystalline layer.

* * * * *